(12) United States Patent
Althaus

(10) Patent No.: US 10,479,304 B2
(45) Date of Patent: Nov. 19, 2019

(54) CAPACITIVE DETECTION DEVICE AND SYSTEM FOR USE IN VEHICLE INTERIOR

(71) Applicant: IEE International Electronics & Engineering S.A., Echternach (LU)

(72) Inventor: Frank Althaus, Saarbrucken (DE)

(73) Assignee: IEE INTERNATIONAL ELECTRONICS & ENGINEERING S.A., Echternach (LU)

( * ) Notice: Subject to any disclaimer, the term of this patent is extended or adjusted under 35 U.S.C. 154(b) by 0 days.

(21) Appl. No.: 15/579,543

(22) PCT Filed: Jun. 2, 2016

(86) PCT No.: PCT/EP2016/062460
§ 371 (c)(1),
(2) Date: Dec. 4, 2017

(87) PCT Pub. No.: WO2016/193354
PCT Pub. Date: Dec. 8, 2016

(65) Prior Publication Data
US 2018/0162308 A1   Jun. 14, 2018

(30) Foreign Application Priority Data
Jun. 5, 2015 (LU) .......................... 92732

(51) Int. Cl.
*G01R 27/26* (2006.01)
*B60R 21/015* (2006.01)
(Continued)

(52) U.S. Cl.
CPC ........ *B60R 21/01532* (2014.10); *B60N 2/002* (2013.01); *B62D 1/046* (2013.01);
(Continued)

(58) Field of Classification Search
USPC .................................................. 324/660–663
See application file for complete search history.

(56) References Cited

U.S. PATENT DOCUMENTS 9,810,727 B2   11/2017   Kandler et al.
2002/0038947 A1   4/2002   Baba et al.
(Continued)

FOREIGN PATENT DOCUMENTS

JP   S6451564 U   3/1989
WO   WO9747976 A2   12/1997
(Continued)

OTHER PUBLICATIONS

International Search Report for International application No. PCT/EP2016/062460, dated Aug. 30, 2016, 4 pages.
(Continued)

*Primary Examiner* — Vincent Q Nguyen
(74) *Attorney, Agent, or Firm* — Reising Ethington P.C.

(57) ABSTRACT

A capacitive detection device and capacitive detection system for use in a vehicle interior includes at least one electrically conductive wire, at least partially attached to a component of the vehicle interior, and at least one electrically conductive layer that is arranged in close proximity to the at least one electrically conductive wire, compared to a potential minimum distance to a vehicle occupant, wherein a galvanic connection between the at least one electrically conductive layer and the at least one electrically conductive wire is avoided.

8 Claims, 2 Drawing Sheets

(51) Int. Cl.
  *B62D 1/04* (2006.01)
  *B62D 1/06* (2006.01)
  *B60N 2/00* (2006.01)
  *G01G 7/06* (2006.01)
  *G01G 19/414* (2006.01)
  *H03K 17/955* (2006.01)

(52) U.S. Cl.
  CPC ............... *B62D 1/065* (2013.01); *G01G 7/06* (2013.01); *G01G 19/4142* (2013.01); *H03K 17/955* (2013.01); *H03K 2217/96078* (2013.01); *H03K 2217/960755* (2013.01)

(56) References Cited

U.S. PATENT DOCUMENTS

| | | | |
|---|---|---|---|
| 2004/0108675 A1* | 6/2004 | Cai | B62D 7/18 280/93.512 |
| 2006/0033507 A1 | 2/2006 | Gaumel et al. | |
| 2006/0231320 A1 | 10/2006 | Kamizono et al. | |
| 2010/0228417 A1 | 9/2010 | Lee et al. | |
| 2014/0224040 A1 | 8/2014 | Van'tZelfde | |
| 2014/0276090 A1* | 9/2014 | Breed | A61B 5/18 600/473 |
| 2015/0279207 A1* | 10/2015 | Breuer | G08C 19/16 398/106 |
| 2017/0247004 A1* | 8/2017 | Putz | A47C 7/748 |

FOREIGN PATENT DOCUMENTS

| | | |
|---|---|---|
| WO | WO03007476 A2 | 1/2003 |
| WO | WO2004069590 A2 | 8/2004 |
| WO | WO2007095068 A2 | 8/2007 |
| WO | WO2012038326 A1 | 3/2012 |
| WO | WO2013057263 A1 | 4/2013 |

OTHER PUBLICATIONS

Written Opinion for International application No. PCT/EP2016/062460, dated Aug. 30, 2016, 6 pages.

* cited by examiner

CAPACITIVE DETECTION DEVICE AND SYSTEM FOR USE IN VEHICLE INTERIOR

TECHNICAL FIELD

The invention relates to a capacitive detection device and a capacitive detection system for use in a vehicle interior, and a vehicle seat and a vehicle steering wheel with an installed such capacitive detection system.

BACKGROUND ART

Vehicle seat occupancy detection systems are nowadays widely used in vehicles, in particular in passenger cars, for providing a seat occupancy signal for various appliances, for instance for the purpose of a seat belt reminder (SBR) system or an activation control for an auxiliary restraint system (ARS). Seat occupancy detection systems include seat occupancy sensors that are known to exist in a number of variants, e.g. based on capacitive sensing, on deformation sensing or on sensing of pressure/force. In order to meet requirements regarding easy integration and required robustness, weight-sensitive seat occupancy sensors have typically been arranged on the B-surface of a vehicle seat, i.e. between a foam body of a seat cushion and a seat pan or cushion-supporting springs of the vehicle seat.

Further, vehicle seat occupancy detection systems are known to be employed as a means of assessing a potential activation of an installed vehicle passenger restraint system, such as an airbag.

It is further known to employ detection systems for detecting a presence or absence of a driver's hands on the steering wheel of a vehicle. Such detection systems provide input, for instance, to automatic driver assistance systems (ADAS).

By way of example, patent application US 2002/0038947 A1 describes an occupant detecting apparatus for detecting an occupant seated on a passenger seat of a vehicle with an airbag for the occupant. A load sensor is provided in a bottom part of the seat. A plurality of first electric field sensors are provided in the bottom part of the seat, and a plurality of second electric field sensors are provided in a rear part of the seat. An airbag inflation permission control unit permits inflation of the airbag in accordance with output signals of the load sensor and the first and second electric field sensors.

Patent application US 20100228417 A1 describes a system and method for determining whether a vehicle driver is holding a steering wheel of the vehicle while the vehicle is in an autonomous driving mode. The vehicle will include an electric power steering (EPS) system and may include an active front steering (AFS) system, both of which include a motor that can apply a high frequency and low amplitude perturbation signal to the steering wheel of the vehicle that is not felt by the vehicle driver and does not cause the vehicle to turn, but is able to be detected by a steering angle sensor. The method subtracts a steering angle command signal from the steering angle signal and removes road disturbances, and then determines whether the induced perturbation signal is present in the steering angle sensor signal. If the perturbation signal is present, then the system knows that the vehicle driver is not holding the steering wheel.

SUMMARY

It is an object of the invention to provide a capacitive detection device for use in a vehicle interior, in particular for detecting a proximal presence or an absence of a vehicle occupant to or from a component of the vehicle interior, with improved performance, high reliability and easy installation.

In one aspect of the present invention, the object is achieved by a capacitive detection device comprising at least one electrically conductive wire that is at least partially attached to a component of the vehicle interior, and a signal generating unit provided for generating a time-varying output signal and for applying the time-varying output signal to each electrically conducting wire of the at least one electrically conductive wire. The capacitive detection device further includes at least one electrically conductive layer that is arranged to at least partially overlap the at least one electrically conductive wire in a direction perpendicular to a portion of an outer surface of the component that is closest to the at least one electrically conductive layer. A galvanic connection between the at least one electrically conductive layer and the at least one electrically conductive wire is avoided.

The ratio of the lesser of a minimum distance between a portion of the outer surface of the component to the at least one electrically conductive wire and a minimum distance between the portion of the outer surface of the component to the at least one electrically conductive layer to the minimum distance between the at least one electrically conductive wire and the at least one electrically conductive layer at a location of the portion of the outer surface of the component is larger than or equal to 2.0 at least for a major portion of the part of the at least one electrically conductive wire that is attached to the component.

The term "vehicle", as used in this application, shall particularly be understood to encompass passenger cars, trucks and buses.

The phrase "major portion", as used in this application, shall in particular be understood as a portion of more than 30%, more preferable of more than 50%, and, most preferable, of more than 70%.

The performance of a capacitive detection device is directly linked to an areal density of a routing of an employed electrically conductive wire. The at least one electrically conductive layer of the capacitive detection device in accordance with an embodiment of the invention amplifies a change in capacitance of the at least one electrically conductive wire in a situation when a vehicle occupant approaches or moves away from the component of the vehicle interior, which can beneficially enable a higher sensitivity of the capacitive detection device, or can allow for easy installation requiring less material effort for achieving the same sensitivity.

The change of the capacitance of the at least one electrically conductive wire can be detected by any simple electronic circuit that appears to be suitable to those skilled in the art.

Preferably, the time-varying output signal is a periodic output signal. The periodic signal may be a sinusoidal signal or a square-wave signal. In one embodiment, the periodic output signal has a fundamental frequency selected from a range between 1 kHz and 1 MHz.

In another aspect of the present invention, a capacitive detection system is provided that comprises a capacitive detection device as disclosed above, and further includes a signal evaluation unit that is provided for sensing a change of an electrical quantity that is indicative of a change in capacitance of the at least one electrically conductive wire, and that is provided for generating an output signal that is representative of the sensed change of the electrical quantity. In this way, a detected absence or proximal presence of the vehicle occupant to the component of the car interior can readily made available to other vehicle or auxiliary control units as an input for the purpose of a seat belt reminder (SBR) system, an activation control for an auxiliary restraint system (ARS) or an automatic driver assistance system (ADAS).

It will be appreciated, that the signal generating unit and the signal evaluation unit may be provided as separate units. In a preferred embodiment, the signal generating unit and the signal evaluation unit are however integrated in a single electronics module or circuit, e.g. in an application-specific integrated circuit (ASIC).

The output provided by the signal evaluation unit may be an analog electric signal, a digital electric signal or a digital optical signal.

Preferably, the change in capacitance of the at least one electrically conductive wire is sensed with regard to a vehicle chassis.

In yet another aspect of the invention, a vehicle seat with an installed capacitive detection system as disclosed above is provided. The vehicle seat includes a seat base configured for taking up a seat base cushion. The seat base and the seat base cushion are provided for supporting a bottom of a seat occupant. The vehicle seat further comprises a backrest that is configured for taking up a backrest cushion provided for supporting a lumbar and back region of the seat occupant. At least one electrically conductive wire of the at least one electric conductive wire of the capacitive detection system is at least partially attached to at least one out of the seat base cushion and the backrest cushion.

In this way, a presence of a seat occupant can readily and reliably be detected. In a suitable embodiment the detected seat occupant can even be categorized, for instance into at least two categories given as "adult" and "child".

If, in another preferred embodiment, the vehicle seat includes a seat heater device with at least one seat heater wire, at least one seat heater wire of the at least one seat heater wire serves as the at least one electrically conductive wire to which the time-varying output signal of the signal generating unit is applied. By that, the hardware effort related to the capacitive detection device can beneficially be reduced. The at least one seat heater wire may be installed at the seat base cushion or at the backrest cushion.

In a possible embodiment of the vehicle seat with an installed capacitive detection system, the capacitive detection system comprises two electrically conductive wires and two electrically conductive layers. Each electrically conductive wire is at least partially overlapped by one of the two electrically conductive layers in a direction that is perpendicular to a portion of one out of a surface of the seat base cushion and a surface of the backrest cushion that is closest to the electrically conductive layer. The two electrically conductive wires are attached to one out of a seat base cushion and a backrest cushion of the vehicle seat, preferably close to a surface. In this way, redundancy is created and reliability for detecting the presence of a seat occupant can be ensured even in case of a single failure of one of the two electrically conductive wires.

In yet another preferred embodiment of the vehicle seat with an installed capacitive detection system, each electrically conductive wire of the at least one electrically conductive wire forms a meandering pattern. The meandering patterns cover a major portion of a surface of the seat base cushion or the backrest cushion. In this way, a seat occupancy can also be detected in cases in which a seat occupant is occupying the seat in a lounged, non-standard manner.

In another aspect of the invention, a vehicle steering wheel with an installed capacitive detection system as disclosed herein is provided. The at least one electrically conductive wire is at least partially attached to the steering wheel in a portion of a circumference of the steering wheel. In this way, a presence of a vehicle driver's hands can readily and reliably be detected and the output signal of the signal evaluation unit can be used in support of an activation control for an automatic driver assistance systems (ADAS).

If the at least one electrical conductive layer is arranged to cover a portion of an outer surface of the steering wheel, such that a high coupling between the wire and the conductive layer is achieved, presence of the vehicle driver's hands can beneficially be detected in a reliable way and for a large number of individual holding positions, including non-standard ones.

In a preferred embodiment of the vehicle steering wheel with an installed capacitive detection system, an areal density of the at least one electrically conductive wire is higher in regions of azimuthal positions with regard to an axis of rotation of the steering wheel that correspond to regular holding positions used by a vehicle driver when driving in a straight forward direction. In this way, a sensitivity for detecting presence of the vehicle driver's hands can be enhanced, in particular in the critical situation of high-speed cruising on a highway.

If the vehicle steering wheel includes a heater device with at least one heater wire, at least one heater wire of the at least one heater wire serves as the at least one electrically conductive wire to which the time-varying output signal of the signal generating unit is applied, beneficially saving hardware and installing effort.

BRIEF DESCRIPTION OF THE DRAWINGS

Preferred embodiments of the invention will now be described, by way of example, with reference to the accompanying drawings, in which.

DESCRIPTION OF PREFERRED EMBODIMENTS

Figure 1:
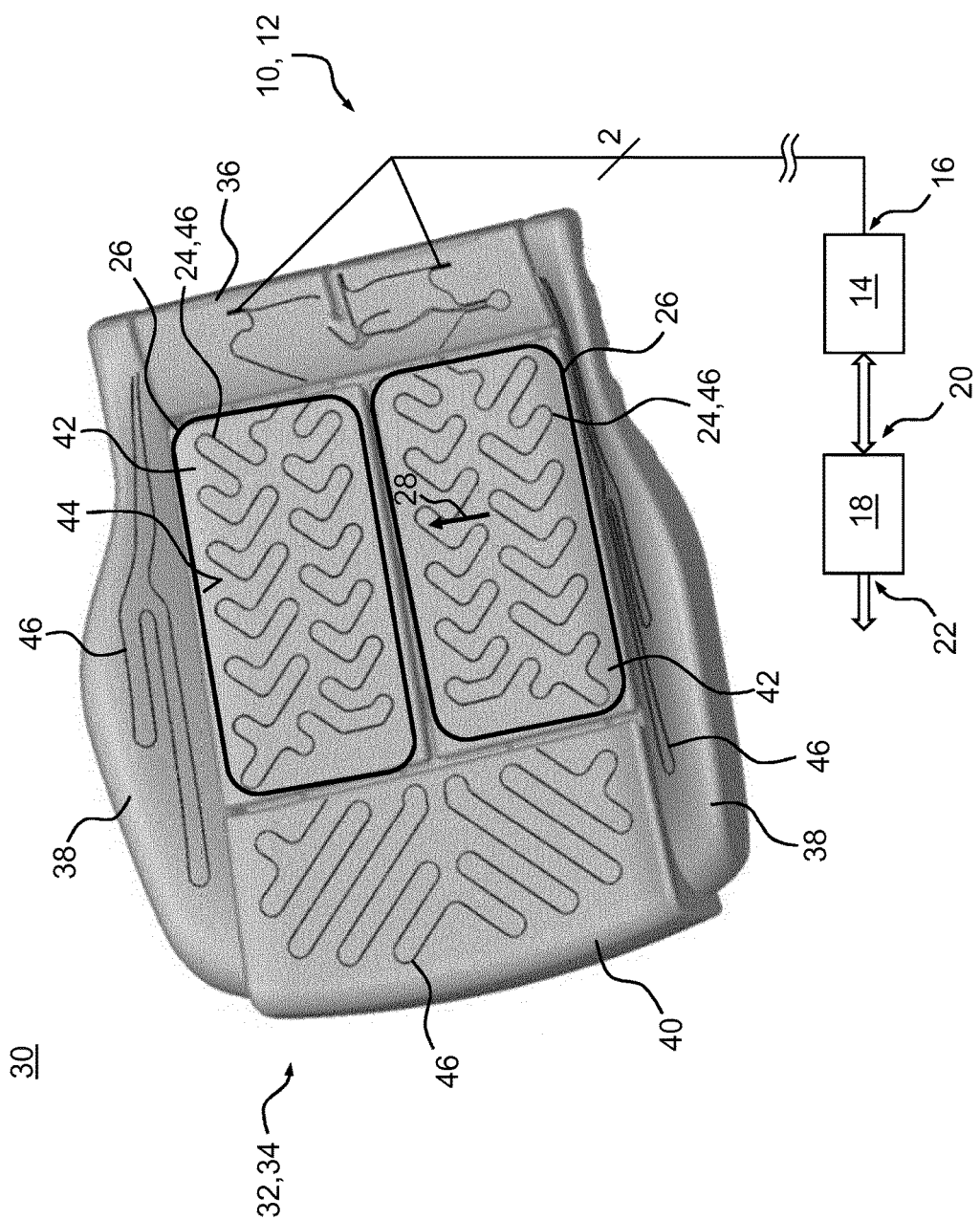
FIG. 1 is a schematic illustration of a vehicle seat with an installed capacitive detection system in accordance with an embodiment of the invention.

FIG. 1 is a schematic illustration of a vehicle seat 30 with an installed capacitive detection system 10 in accordance with an embodiment of the invention. The vehicle seat 30 comprises a seat base 32 configured for taking up a seat base cushion 34. The seat base 32 and the seat base cushion 34 are provided for supporting a bottom of a seat occupant 50. The vehicle seat 30 further includes a backrest configured for taking up a backrest cushion provided for supporting a lumbar and back region of the seat occupant 50. The backrest, which is not shown in FIG. 1 for reasons of clarity, is arranged at a rear edge 36 of the seat base 32 shown on the right-hand side of FIG. 1.

The vehicle seat 30 includes a seat heater device including a one or more seat heater wires 46 made e.g. from Constantan® wire having an outer electrical insulation layer 52. The seat heater wire or wires 46 is/are arranged in the vehicle seat 30 so as to extend through the various locations of the seat. One part of the heater wire 46 each is attached to each one of two seat base cushion side members 38 that are provided for supporting the seat occupant's thighs. Another portion of the heater wire 46 is attached to a seat base cushion front member 40, and two more portions of the heater wire are attached to a two-part seat base cushion center member 42, close to the A surface 44 of the seat base cushion 34. It will be noted that the different heater wires of the different portions of the heater wire may be independent from each other or may be interconnected so as to form a single heater loop. As will be explained in the following, this heater wire or heater wires 46 serve as electrically conductive wire 24 to which a time-varying output signal of a signal generating unit 14 of the capacitive detection system 10 will be applied.

The capacitive detection system 10 comprises the electrically conductive wire 24 formed by the heater wire 46 that is attached to the seat base cushion center member 42. The conductive wire 24 forms a meandering pattern that is arranged in parallel to the A surface 44 of the seat base cushion center member 42. The capacitive detection system 10 further includes two electrically conductive layers 26. Each electrically conductive layer 26 is arranged to overlap the meandering pattern formed by two heater wire 24, 46 attached to the two parts of the seat base cushion center member 42 in a direction 28 that is perpendicular to a portion of a surface of the seat base cushion center member 42 that is closest to the electrically conductive layer 26. The conductive layer 26 is arranged to overlap the meandering pattern at least in the area where a person/hand is expected to be in proximity. It will be appreciated that instead of two separate electrically conductive layers 26, a single electrically conductive layer may be arranged overlapping both parts of the seat base cushion center member 42.

Due to the outer electrical insulation 52 of the electrically conductive wire 24/heater wire 46 and an optional electrical insulating layer, which may be positioned between the electrically conductive layer 26 and the electrically conductive wire 24, a galvanic connection between the electrically conductive layers 26 and the electrically conductive wire 24 is avoided. The meandering patterns formed by the electrically conductive wire 24/heater wire 46 covers a major portion of the surface of the seat base cushion center member 42.

Moreover, the capacitive detection system 10 includes a signal generating unit 14 and a signal evaluation unit 18, which are installed remotely from the vehicle seat 30. The signal generating unit 14 is electrically connected with its output port(s) 16 to the electrically conductive wire(s) 24 formed by the heater wire(s) that is/are attached to the seat base cushion center member 42. The signal generating unit 14 is provided for generating a sine-wave output signal and for applying the output signal to the electrically conducting wire 24 or the electrically conductive wires 24.

The electrically conductive wire 24 is connected via the signal generating unit 14 to an input port 20 of the signal evaluation unit 18. The signal evaluation unit 18 is provided for sensing a change of an electrical quantity that is indicative of a change in capacitance of the electrically conductive wire 24, and is provided for generating an output signal at its output port 22 that is representative of the sensed change of the electrical quantity.

It will be appreciated, that the signal generating unit 14 and the signal evaluation unit 18 are preferably integrated in a single electronics module or circuit, e.g. in an application-specific integrated circuit (ASIC).

Figure 2:
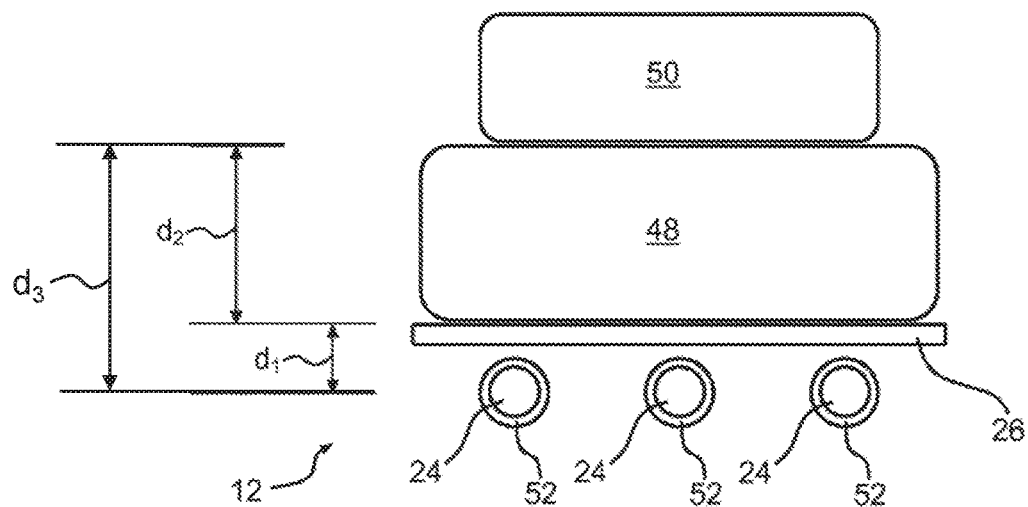
FIGS. 2 and 3 schematically show a configurations of a capacitive detection device in accordance with an embodiment of the invention and a vehicle occupant.

A configuration of the capacitive detection device 12 and the seat occupant 50 is schematically shown in FIG. 2. The configuration as well applies to a vehicle steering wheel with an installed capacitive detection system 10 in accordance with an embodiment of the invention and a vehicle occupant holding the steering wheel as a driver of the vehicle, which therefore will not be described to avoid repetition.

Figure 3:
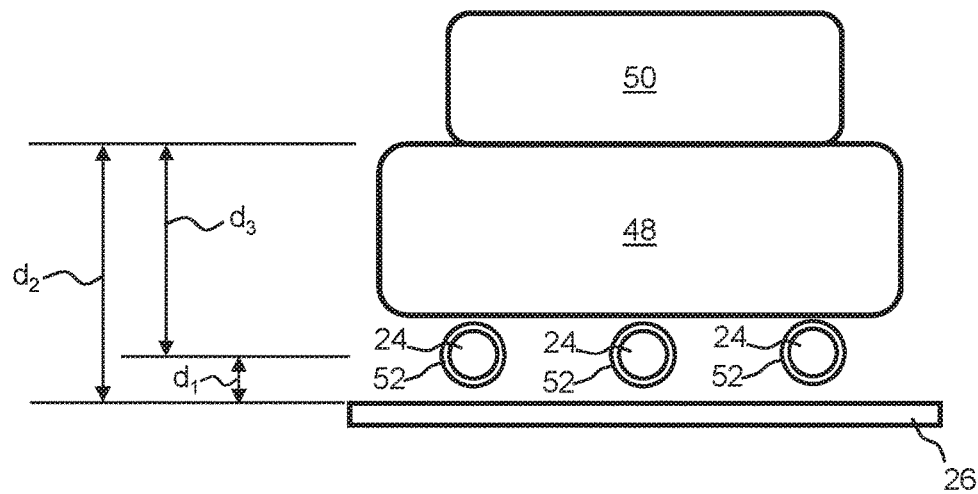

In FIG. 2, which expressly is not meant to scale, the electrically conductive wire 24 to which the square-wave output signal is applied is shown in the bottom part, being arranged close to the A surface 44 of the seat base cushion center member 42 (not shown in FIG. 2). Above the electrically conductive wire 24, the electrically conductive layer 26 is positioned in a minimum distance $d_1$. In principle, as shown in FIG. 3, the sequence of the electrically conductive wire 24 and the electrically conductive layer 26 may be reversed, such that the electrically conductive wire 24 is positioned above the electrically conductive layer 26. Above the electrically conductive layer 26, a trim layer 48 of a vehicle interior component is shown, which in case of the vehicle seat 30 shown in FIG. 1 may be a cover layer of the seat base cushion 34 or the backrest cushion, and in case of a vehicle steering wheel may be the trim layer of the steering wheel. The closest position to the capacitive detection device 12 that the seat occupant 50 can take is to be in contact with the cover layer of the seat base cushion 34 (or the backrest cushion), or the steering wheel trim layer, respectively.

The minimum distance (d3) is a minimum distance taken at a location where a portion of the outer surface of the vehicle interior component is closest to the electrically conductive wire 24. In FIG. 2, the minimum distance d3 is given by $d_1+d_2$. The minimum distance between the portion of the outer surface of the component to the electrically conductive layer 26 is given by $d_2$. The lesser of these two minimum distances is therefore given by $d_2$ in the shown embodiment.

A ratio of the lesser of the two minimum distances to the minimum distance $d_1$, between the electrically conductive wire 24 and the electrically conductive layer 26 at a location of the portion of the outer surface of the component is thus given by $d_2/d_1$ and is larger than or equal to 2.0 (in the embodiment shown in FIG. 2 about 2.6) for a major portion of the part of the electrically conductive wire 24 that is attached to the component, i.e. the seat base cushion center member 42.

While one or more embodiments of the invention have been illustrated and described in detail in the drawings and foregoing description, such illustration and description are to be considered illustrative or exemplary and not restrictive; the invention is not limited to the disclosed embodiments.

Other variations to be disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting scope.

The invention claimed is:

1. A capacitive detection device for use with a component of a vehicle interior, comprising:
   at least one electrically conductive wire disposed beneath an outer surface of the component of the vehicle interior and arranged to extend in a direction substantially parallel to an outer surface of the component of the vehicle interior, a signal generating unit configured to generate and apply a time-varying output signal to the at least one electrically conductive wire, a signal evaluation unit configured to sense a change of an electrical quantity that is indicative of a change in capacitance of the at least one electrically conductive wire, and to generate an output signal that is representative of the sensed change of the electrical quantity, at least one electrically conductive layer arranged substantially parallel to at least a portion of the outer surface of the component of the vehicle interior and positioned with respect to a direction perpendicular to the outer surface of the component of the vehicle interior either above or below the at least one electrically conductive wire, and arranged to at least partially overlap the at least one electrically conductive wire in a direction perpendicular to a portion of an outer surface of the component of the vehicle interior that is closest to the at least one electrically conductive layer, wherein a galvanic connection between the at least one electrically conductive layer and the at least one electrically conductive wire is avoided, wherein at least a major portion of the at least one electrically conductive wire is arranged with respect to the at least one electrically conductive layer and the outer surface of the component of the vehicle interior such that a ratio R≥2, wherein R is given by:

$$R = \frac{\min(d2, d3)}{d1} \geq 2$$

wherein d1 is a minimum distance taken at a location where the at least one electrically conductive wire is closest to the at least one electrically conductive layer, d2 is a minimum distance taken at a location where the portion of the outer surface of the component of the vehicle interior is closest to the at least one electrically conductive layer, and d3 is a minimum distance taken at a location where the portion of the outer surface of the component of the vehicle interior is closest to the at least one electrically conductive wire.

2. A vehicle seat with an installed capacitive detection system as claimed in claim 1 the vehicle seat comprising a seat base configured for taking up a seat base cushion, the seat base and the seat base cushion being provided for supporting a bottom of a seat occupant, and a backrest configured for taking up a backrest cushion provided for supporting a lumbar and back region of the seat occupant, wherein the component of the vehicle interior includes at least one of the seat base cushion and the backrest cushion, and wherein at least one electrically conductive wire of the at least one electrically conductive wire is at least partially attached to at least one of the seat base cushion and the backrest cushion.

3. The vehicle seat as claimed in claim 2, further comprising a seat heater device including at least one seat heater wire, wherein at least one seat heater wire of the at least one seat heater wire serves as the at least one electrically conductive wire to which the time-varying output signal of the signal generating unit is applied.

4. The vehicle seat as claimed in claim 2, wherein each electrically conductive wire of the at least one electrically conductive wire forms a meandering pattern, and wherein the meandering pattern covers a major portion of a surface of the seat base cushion or the backrest cushion.

5. A vehicle steering wheel with an installed capacitive detection system as claimed in claim 1, wherein the component of the vehicle interior includes the steering wheel, and wherein the at least one electrically conductive wire is at least partially attached to the steering wheel in a portion of a circumference of the steering wheel.

6. The vehicle steering wheel as claimed in claim 5, wherein the at least one electrically conductive layer is arranged to cover a portion of a surface of the steering wheel.

7. The vehicle steering wheel as claimed in claim 5, wherein an areal density of the at least one electrically conductive wire is higher in regions of azimuthal positions with regard to an axis of rotation of the steering wheel that correspond to regular holding positions used by a vehicle driver when driving in a straight forward direction.

8. The vehicle steering wheel as claimed in claim 5, the vehicle steering wheel further including a heater device with at least one heater wire, wherein at least one heater wire of the at least one heater wire serves as the at least one electrically conductive wire to which the time-varying output signal of the signal generating unit is applied.

* * * * *